SWEEP GENERATOR CIRCUIT

Filed Oct. 12, 1955

INVENTOR:
ROBERT B. DOME,
BY Donald N. Timbie
HIS ATTORNEY.

United States Patent Office 2,874,291

Patented Feb. 17, 1959

2,874,291

SWEEP GENERATOR CIRCUIT

Robert B. Dome, Geddes Township, Onondaga County, N. Y., assignor to General Electric Company, a corporation of New York Application October 12, 1955, Serial No. 540,119

10 Claims. (Cl. 250—36)

This invention relates to improvements for sweep generators in which the switching or tuning function is performed by a cathode-coupled multivibrator.

As is well known by those skilled in the art, sweep voltage waves for use in cathode-ray deflection systems generally have a sawtoothed shape, one side having a much lower average slope than the other. The portion of the wave having the lower slope is generally formed by a circuit including a relatively large resistor, a capacitor and a relatively small peaking resistor connected in series between a point of positive potential and ground, the desired output being taken across the capacitor and the peaking resistor. The portion of the wave having the steeper slope is developed across the capacitor and the peaking resistor by switching a low resistance discharge path in parallel with the capacitor and the peaking resistor.

This switching function is generally performed by an electron discharge device connected in parallel with the capacitor and peaking resistor. During the portion of the sweep wave having the lower average slope, the discharge device has a high impedance and may even be cut off so that no discharge of the capacitor takes place, but during the portion of the sweep wave having the steeper slope, the discharge device conducts heavily so as to present a low resistance path through which the capacitor may be quickly discharged.

Proper operation of the discharge device has been secured by making it an integral part of a multivibrator circuit, as at least one discharge device of a multivibrator changes from a non-conduction to heavy conduction during a cycle of operation. However, the frequency of a basic multivibrator is strongly affected by practical operating conditions such as changes in the characteristics of the amplifiers, as well as by variations in the values of components or in the operating potentials applied to the circuit. In order to stabilize the multivibrator so that its frequency does not drift as much under these conditions, it has been customary to provide a parallel resonant circuit in an output or an input circuit of one of the amplifiers. One problem in such a stabilizing circuit is the fact that variations in the impedances of the amplifiers of the multivibrator still have an effect on its frequency and such variations occur under some of the practical operating conditions noted above. Whereas altering the tuning of the parallel resonant circuit may compensate for a certain amount of frequency drift, it has been found that a multivibrator stabilized by a parallel resonant circuit tends to lock on a submultiple of the desired frequency. If, for example, the multivibrator is part of the horizontal deflection circuit of a television receiver, this would cause two images, each having half the proper width, to appear on the television viewing screen.

Accordingly, it is an object of this invention to improve the stability of a sweep generator employing a mulitvibrator.

Because even a stabilized multivibrator does not hold an exact frequency and because the deflection frequency of all transmitters is not precisely the same, it has been customary to compare the frequency or phase of the multivibrator with the frequency or phase of the incoming synchronizing pulses in what is generally termed a phase detector. The control voltage at the output of the phase detector varies in accordance with the difference between the phase and frequency of the multivibrator and the synchronizing pulses and is applied to the multivibrator to maintain it in phase and frequency synchronization with the synchronizing pulses. Generally, the control voltage is applied so as to vary the bias on one of the amplifiers. The variation in the frequency of the multivibrator with the control voltage may be termed the control curve. If this curve is smooth, the transient response of the automatic frequency control system can be selected as desired without risk that it will contain frequencies that will produce instability or non-linear effects. Sweep circuits having stabilization provided by parallel resonant circuits exhibit radical variations of frequency with the control voltage so that their control curve is anything but smooth.

It is another object of this invention to provide a stabilized multivibrator sweep circuit that exhibits a smooth change in frequency as the applied control voltage varies.

Furthermore, if the slope of the control curve changes with control voltage, as it does in a multivibrator stabilized with a parallel resonant circuit, the frequency of the multivibrator may be depressed until it shifts to a subharmonic frequency.

Accordingly, another object of the invention is to provide a multivibrator sweep circuit in which the slope of the control curve remains substantially constant during variations in the control voltage applied to the amplifiers of the multivibrator.

Inasmuch as the tuning of the resonant circuit used to stabilize a multivibrator has a marked effect on the slope of the control curve, the gain of the automatic frequency control system, the stability, the point at which the multivibrator goes into a lower frequency oscillation, the pull-in range and the transient response, it is not surprising that it is often difficult to make a proper initial adjustment, nor is it surprising that any changes made in this tuning in an attempt to compensate for variations elsewhere in the circuit often leads to difficulties.

It is, therefore, another object of this invention to provide a stabilized multivibrator sweep circuit that is easy to adjust.

Briefly, this invention may attain the above objectives and advantages in the the following manner. A band-pass filter, adapted to pass signals having a frequency near that at which the multivibrator is to operate, is connected between the output of the switching amplifier of the multivibrator and a control electrode of the other amplifier that does not normally draw current. If the multivibrator is comprised of triodes having their cathodes connected for one feedback path and a coupling between the anode of the first triode and the grid of the second triode, the band-pass filter may be coupled between the output of the second triode and the grid of the first. Inasmuch as this grid does not draw current, it has no effect on the characteristics of the band-pass filter.

The manner in which the above objectives are attained by this invention will be more clearly understood after the following discussion taken in connection with the drawings in which.

Figure 1:
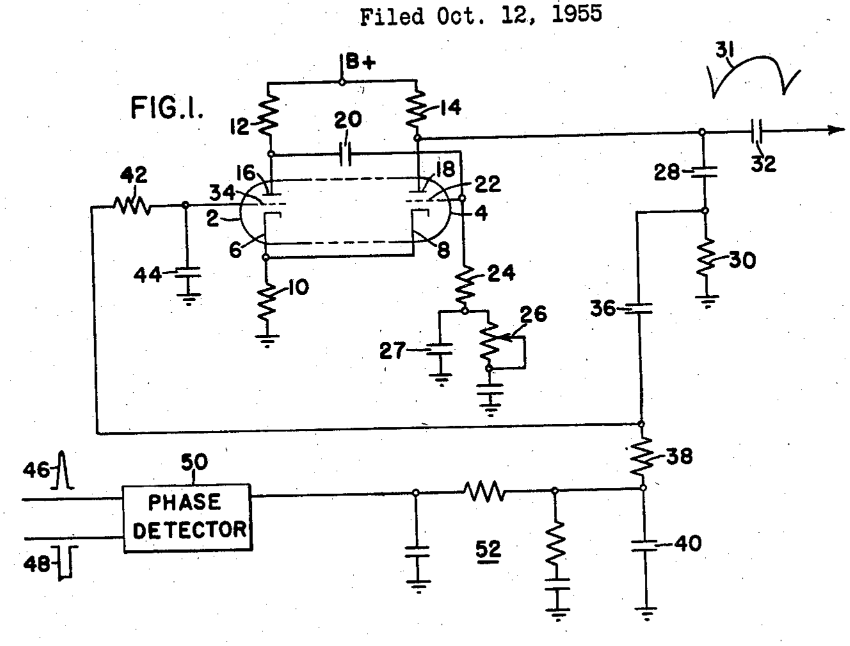
Figure 1 is a schematic diagram of a sweep generation circuit embodying this invention.

As will be recognized by those skilled in the art, amplifiers 2 and 4, which may be triodes as shown, are connected so as to form a cathode-coupled multivibrator circuit. They may be in separate envelopes or enclosed in a single envelope. The cathodes 6 and 8 are directly connected and a cathode resistor 10 is connected between them and ground. Plate-load resistors 12 and 14 are respectively connected between the plates 16 and 18 and a point of B+ potential. A coupling capacitor 20 is connected between the plate 16 of the amplifier 2 and a grid 22 of the amplifier 4. A suitable grid-leak resistor 24 and a frequency control 26 in the form of a variable resistance, generally termed a hold control, are connected in series between the grid 22 and ground. A bypass capacitor 27 may be connected in parallel with the frequency control 26 so as to bypass any strong signals picked up by the leads connecting the frequency control 26 to the grid-leak resistor 24. A sweep-generator capacitor 28 and a peaking resistor 30 are connected in series between the anode 18 of the amplifier 4 and a point of reference potential such as ground. The desired sweep-voltage wave 31 is formed across the sweep capacitor 28 and the peaking resistor 30 and may be coupled to the deflection system by a coupling or blocking capacitor 32.

In accordance with this invention, a band-pass filter is coupled between the anode 18 of the amplifier 4 and a control electrode which, in this embodiment of the invention, is a grid 34 of the amplifier 2. As shown, the filter is primarily comprised of a differentiation network comprised of a capacitor 36 and a resistor 38 connected in the order named between the junction of the sweep capacitor 28 and the peaking resistor 30 and an effective ground. Actually, the lower end of the resistor 38 is connected to ground via a capacitor 40, but this capacitor is large enough to present very little impedance for frequencies applied to the capacitor 36. Hence, the lower end of the resistor 38 may be said to be effectively grounded. An integration circuit, comprised of a resistor 42 and a capacitor 44 is connected between the junction of the capacitor 36 and the resistor 38 and a point of reference potential such as ground. As the integrated output appears across the capacitor 44, the grid 34 is connected to the junction of this capacitor and the resistor 42.

If desired, automatic frequency control may be provided by applying a flyback pulse 46 and a synchronizing pulse 48 to a phase detector 50. An anti-hunt network 52 may be used to couple the control voltage at the output of the phase detector to the junction of the resistor 38 and the capacitor 40. As previously mentioned, the capacitor 40 is of such a value as to present a high impedance for frequencies occurring at the output of the phase detector 50 and a negligible impedance for the frequency of oscillation of the multivibrator.

Figure 2:
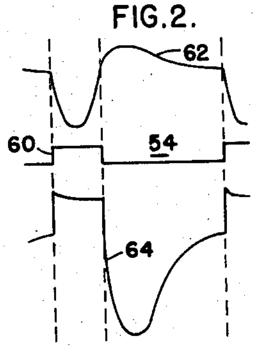
Figure 2 is a series of graphs useful in explaining the operation of Figure 1.

The operation of the conventional portion of the circuit of Figure 1, may be as follows. While the amplifier 4 is cut off, the sweep voltage wave 31 is developed across the capacitor 28 and the peaking resistor 30, as the capacitor charges toward B+ through the load resistor 14. This charging action continues until the anode 18 is sufficiently positive to cause the amplifier 4 to conduct and apply a sudden increase in positive potential to the cathode 6. Wave 54 of Figure 2, indicates the variation in potential of the cathodes 6 and 8, and the numeral 60 indicates the sudden increase just mentioned. The conduction of the amplifier 4 discharges the sweep capacitor 28 at a rate that is relatively rapid to the charging rate, as the resistance of the discharge path, comprised of the peaking resistor 30, the cathode resistor 10 and the resistance of the amplifier 4 itself, is rather small. As is well known, an increase in potential of the cathode 6 is amplified in the amplifier 2 and is coupled to the grid 22 of the amplifier 4 so as to cause it to conduct more heavily. A limit is reached when the amplifier 4 is saturated. During this time, the right hand plate of the capacitor 20 becomes negatively charged as the grid 22 draws current. At some point, the capacitor 28 is discharged to such an extent that the voltage across it and, hence, the voltage at the anode 18 is so small as not to be able to maintain the amplifier 4 in conduction. At this point, the charging of the sweep capacitor 28 begins again. Generally, the amplifier 2 is operated class A so that the grid 34 does not draw current.

The effect of the band-pass filter of the invention is as follows. At the beginning of the discharge of the capacitor 28, the voltage across the peaking resistor drops suddenly. As the band-pass filter, here shown as being comprised of a differentiation network, made up of the capacitor 36 and the resistor 38, and an integration network, made up of the resistor 42 and the capacitor 44, passes frequencies in the vicinity of the oscillation frequency of the multivibrator, the voltage at the grid 34 of the amplifier 2 may appear as indicated by the wave 62 of Figure 2. The combined effect of the grid voltage wave 62 and the cathode voltage wave 54 is such as to produce a wave 64 of Figure 2 at the grid 22 of the amplifier 4. It will be noted that just as the amplifier 4 should be ready to fire, the voltage wave 64 is nearing its maximum positive voltage at the grid 22 so as to tend to insure that the amplifier 4 fires at the correct time.

It will be observed that neither of the amplifiers 2 and 4 can have much effect on the characteristics of the band-pass filter, as the amplifier 4 is cut off during most of the deflection cycle and the grid 34 of the amplifier 2 draws no current. Accordingly, variations in tube characteristics will not prevent the band-pass filter from causing the potential of the grid 22 to approach its maximum value, just as the amplifier 4 should conduct.

One advantage of this arrangement is that the voltage applied to the grid 34, via the additional feedback path is amplified by the amplifier 2. Hence, even though the slope of this feedback voltage is not great, the actual change in voltage at the grid 22, in a given time, may be very great. Hence, there is a tendency for the amplifier 4 to conduct at the central frequency of the band-pass filter.

In order that the phase of the wave applied to the grid 34 be proper, it will generally be found that the phase shifts of the differentiation and integration networks be equal or nearly so.

Although the sweep capacitor 28 and the peaking resistor 30 perform some differentiation, most of it is provided by the capacitor 36 and the resistor 38. As far as the stabilization of the multivibrator is concerned, the capacitor 36 might be directly connected to the anode 18, and the sweep capacitor 28 and peaking resistor 30 could be eliminated. In the arrangement shown, however, the basic frequency of the multivibrator is largely determined by the sweep capacitor 28 and the resistor 14 and proper feedback characteristics are controlled by the band-pass filter. This is a desirable situation as each of the respective circuits can be designed for one particular function.

The following table indicates values of the various components, which have proven satisfactory, when the circuit was incorporated in a television receiver. It will be well understood by those skilled in the art that other values could be used, especially, if the circuit is to operate at an entirely different frequency.

| | | |
|---|---|---|
| Amplifiers 2 and 4 | | 7AU7 |
| Resistor 10 | ohms | 2,200 |
| Resistor 12 | do | 22,000 |
| Resistor 14 | do | 36,000 |

| | | |
|---|---|---|
| Resistor 24 | do | 75,000 |
| Resistor 26 | do | 100,000 |
| Resistor 30 | do | 16,000 |
| Capacitor 20 | μμf | 430 |
| Capacitor 27 | μf | .01 |
| Capacitor 28 | μμf | 620 |
| Capacitor 40 | μμf | 5,000 |
| Capacitor 44 | μμf | 300 |

Figure 3:
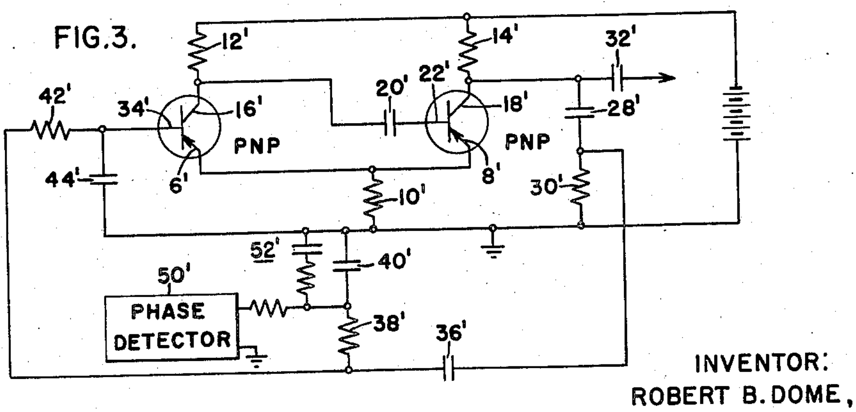
Figure 3 is an embodiment of the invention wherein the amplifiers are transistors.

The circuit of Figure 3 illustrates an embodiment of this invention wherein the amplifiers are transistors. For purposes of convenience, components having corresponding functions are indicated by the same numerals primed. It will be apparent to those skilled in the art that the base electrodes 34′, 22′ and the emitter electrodes 6′, 8′ are control electrodes and that the collectors 16′, 18′ are output electrodes. Other transistor configurations could be used to form a multivibrator circuit, but the grounded emitter configuration, shown in Figure 3, is highly advantageous. As shown the transistors are of the P-N-P type but it is well known to those skilled in the art that other types could be used.

While I have illustrated particular embodiments of my invention, it will of course be understood that I do not wish to be limited thereto, since various modifications, both in the circuit arrangement and in the instrumentalities, may be made and I contemplate by the appended claims to cover any such modifications as fall within the true spirit and scope of the invention.

What I claim as new and desire to secure by Letters Patent of the United States is:

1. A stabilized multivibrator circuit comprising a first amplifier having an output electrode and two control electrodes, a second amplifier having an output electrode and two control electrodes, means for coupling a control electrode of said first amplifier to a control electrode of said second amplifier, means for coupling the output electrode of said first amplifier to another control electrode of said second amplifier, and a band-pass filter coupled between the output electrode of said second amplifier and the other control electrode of said first amplifier, a source of potential, load impedances individually coupled to said source from said output electrodes, said band-pass filter being adapted to pass the frequency at which the multivibrator formed by said amplifiers oscillates.

2. A multivibrator circuit as set forth in claim 1 wherein said band-pass filter is comprised of differentiation and integration networks connected in cascade.

3. A multivibrator circuit comprising in combination a first amplifier having an anode, grid and cathode, a second amplifier having an anode, grid and cathode, a point of positive potential, a load resistor connected between one of said anodes and said point, another load resistor connected between the other of said anodes and said point, a point of reference potential that is not as positive as said first-mentioned point, a cathode resistor connected between said cathodes and said point of reference potential, a capacitor connected between the anode of said first amplifier and the grid of said second amplifier, a grid-leak resistor connected between the grid of said second amplifier and said point of reference potential, a sweep voltage capacitor and a peaking resistor connected in series in the order named between the anode of said second amplifier and said point of reference potential, a differentiation circuit comprised of a capacitor and a resistor connected in series in the order named between the junction of said peaking resistor and said sweep voltage capacitor and said point of reference potential, an integration circuit comprised of a resistor and a capacitor connected in series in the order named between the junction of the capacitor and resistor of said differentiation circuit and said point of reference potential, and a connection between the junction of the resistor and capacitor of said integration circuit and the grid of said first amplifier.

4. A circuit as set forth in claim 3 wherein a source of control voltage is inserted between said resistor of said differentiation circuit and said point of reference potential.

5. A multivibrator circuit comprising in combination first and second amplifiers each having first and second control electrodes and an output electrode, a coupling between the output electrode of said first amplifier and a first control electrode of said second amplifier, a band-pass filter coupled between the output electrode of said second amplifier and a first control electrode of said first amplifier, a direct connection between the second control electrodes of each amplifier.

6. A sweep voltage wave generator circuit comprising in combination a cathode-coupled multivibrator having two amplifiers, each of said amplifiers having an anode, cathode and grid, a band-pass filter connected between the anode of one of said amplifiers and the grid of the other, said band-pass filter passing frequencies in the vicinity of the frequencies of oscillation of said multivibrator, and a capacitor connected between said latter anode and a point of reference potential.

7. A generator as set forth in claim 6 in which said band-pass filter is comprised of a differentiation network and integration network connected in series.

8. A multivibrator circuit comprising in combination a first amplifier having a pair of control electrodes and an output electrode, a second amplifier having a pair of control electrodes and an output electrode, a point of reference potential, an impedance connected between a control electrode of each amplifier and said point of reference potential, a point of operating potential, a first load impedance connected between the output electrode of said first amplifier and said point of operating potential, a second load impedance connected between the output electrode of said second amplifier and said point of operating potential, a capacitor connected between the output electrode of said first amplifier and a control electrode of said second amplifier, a sweep capacitor and a peaking resistor connected in series between the output electrode of said second amplifier and said point of reference potential, and a band-pass filter coupled between the output electrode of said second amplifier and a control electrode of said first amplifier.

9. A multivibrator circuit as set forth in claim 8 wherein said band-pass filter is comprised of a differentiation circuit and an integration circuit connected in cascade.

10. A multivibrator circuit as set forth in claim 8 wherein said band-pass filter is coupled to the output electrode of said second amplifier via said sweep capacitor.

References Cited in the file of this patent

UNITED STATES PATENTS

| | | |
|---|---|---|
| 2,182,555 | Geiger | Dec. 5, 1939 |
| 2,186,571 | Beale | Jan. 9, 1940 |
| 2,436,808 | Jacobsen | Mar. 2, 1948 |
| 2,443,922 | Moore | June 22, 1948 |
| 2,553,165 | Bliss | May 15, 1951 |
| 2,743,364 | Kraft | Apr. 24, 1956 |
| 2,748,285 | Beaufoy | May 29, 1956 |